United States Patent [19]
Pankove

[11] Patent Number: 4,551,352
[45] Date of Patent: Nov. 5, 1985

[54] METHOD OF MAKING P-TYPE HYDROGENATED AMORPHOUS SILICON

[75] Inventor: Jacques I. Pankove, Princeton, N.J.

[73] Assignee: RCA Corporation, Princeton, N.J.

[21] Appl. No.: 692,238

[22] Filed: Jan. 17, 1985

[51] Int. Cl.⁴ ............................................... B05D 3/06
[52] U.S. Cl. ...................................... 427/39; 427/85; 427/95; 427/372.2
[58] Field of Search ................... 427/39, 85, 95, 372.2

[56] References Cited

U.S. PATENT DOCUMENTS

| | | | |
|---|---|---|---|
| 3,258,663 | 6/1966 | Weimer | 317/235 |
| 4,064,521 | 12/1979 | Carlson | 357/2 |
| 4,229,502 | 10/1980 | Wu et al. | 428/446 |
| 4,309,224 | 1/1982 | Shibata | 148/1.5 |
| 4,379,020 | 4/1983 | Glaeser et al. | 156/603 |
| 4,457,949 | 7/1984 | Takasaki et al. | 427/39 |
| 4,496,450 | 1/1985 | Hitotsuyanagi et al. | 427/39 |

*Primary Examiner*—Bernard D. Pianalto
*Attorney, Agent, or Firm*—Birgit E. Morris; Donald S. Dohen

[57] ABSTRACT

A layer of P-type hydrogenated amorphous silicon having a wide band gap and relatively low conductivity is formed by subjecting a substance to a gaseous mixture of a silicon hydride and an acceptor material in a glow discharge while heating the substrate to a temperature of no greater than 120° C. The deposited acceptor-doped hydrogenated amorphous silicon layer is then heated at a temperature of between 130° C. and 300° C. to increase the conductivity of the layer.

6 Claims, No Drawings

METHOD OF MAKING P-TYPE HYDROGENATED AMORPHOUS SILICON

The present invention relates to a method of making P-type hydrogenated amorphous silicon and, more particularly, to a method of increasing the conductivity of wide band gap P-type hydrogenated amorphous silicon.

BACKGROUND OF THE INVENTION

It has been discovered that films of hydrogenated amorphous silicon can be doped and used to form various types of semiconductor devices. U.S. Pat. No. 4,064,521 to David E. Carlson, issued Dec. 20, 1977 entitled "Semiconductor Device Having Body of Amorphous Silicon" which is incorporated herein by reference, discloses a method of forming hydrogenated amorphous silicon and various semiconductor devices which can be made with this material. However, it has been found difficult to form acceptor-doped hydrogenated amorphous silicon which has a wide band gap, i.e. contains a large amount of hydrogen, and is conductive. To deposit conductive P-type hydrogenated amorphous silicon it has been found necessary to deposit the material at relatively high temperatures, above 300° C. However, the higher the deposition temperature the lower the amount of hydrogen that becomes incorporated in the amorphous silicon so that at these relatively high deposition temperatures, the amount of incorporated hydrogen is relatively low.

SUMMARY OF THE INVENTION

P-type hydrogenated amorphous silicon is formed by subjecting a substrate to a gaseous mixture of a silicon hydride and an acceptor material, with the substrate being at a temperature no greater than about 120° C., to deposit a layer of acceptor doped hydrogenated amorphous silicon on the substrate. The deposited layer is then heated at a temperature greater than 130° C. but less than the temperature at which hydrogen will disassociate from the layer thereby, increasing the conductivity of the deposited layer.

DETAILED DESCRIPTION OF PREFERRED EMBODIMENT

I have found that by depositing an amorphous silicon layer on a substrate by placing the substrate in a glow discharge which contains a gaseous mixture of a silicon hydride, such as silane or a polysilane, and an acceptor material, and heating the substrate to a temperature of no greater than about 120° C., the resultant amorphous silicon film will have a high content of hydrogen. The amorphous silicon layer will be so rich in hydrogen that all of the silicon dangling bonds will be passivated by the hydrogen, including those in the vicinity of the acceptor atoms. Thus, the acceptor-like character of tetrahedrally coordinated acceptor atoms will be neutralized and the hydrogenated amorphous silicon layer will have a very low conductivity. This applies to the generally used acceptor materials for silicon, such as boron, gallium and aluminum. Thus, although the acceptor containing hydrogenated amorphous silicon layer which is so deposited at a low temperature is rich in hydrogen, so as to have a wide band gap, it has poor conductivity. However, I have also found that if this acceptor containing hydrogenated amorphous silicon layer is then heated at a temperature greater than about 120° C. but less than the temperature at which hydrogen disassociates from the amorphous silicon, about 350° C., and preferably at about 180° C. ±30° C., the hydrogen atoms near the acceptor atoms become disassociated, but the hydrogen atoms that passivate other silicon dangling bonds do not disassociate. Thus, all of the tetrahedrally bonded acceptor atoms become active acceptors and the hydrogenated amorphous silicon becomes more conducting. Thus, this method of depositing the P-type hydrogenated amorphous silicon layer at a low temperature followed by heating at a higher temperature provides an amorphous silicon layer which has a high content of hydrogen, so as to be a wide band gap material, and is conductive.

EXAMPLE

Using the plasma deposition method apparatus described in the Carlson U.S. Pat. No. 4,064,521, a glass substrate was placed in the deposition chamber. While heating the glass substrate to a temperature of 100° C., a gaseous mixture of 1% of volume of $B_2H_6$ in $SiH_4$ was admitted into the chamber. A plasma was generated between the electrodes in the chamber to disassociate the gases and deposit a layer of boron doped hydrogenated amorphous silicon on the heated glass substrate. The deposition was carried out until an amorphous silicon layer 1380 angstroms in thickness was deposited on the glass substrate. A portion of the glass substrate having the boron doped hydrogenated amorphous silicon layer thereon was broken off and heated in a vacuum at 200° C. for one hour. Aluminum stripped electrodes were deposited by evaporation in a vacuum on the amorphous silicon layers of each of the specimens and the resistance of each of the layers was measured. The as deposited amorphous silicon layer had a resistance value of 700,000 ohm-centimeters and the amorphous silicon layer which was heated had a resistance value of 1166 ohm-centimeters. Thus, heating the boron doped hydrogenated amorphous silicon layer increased the conductivity of the layer by about 600times.

The P-type hydrogenated amorphous silicon layer formed by the method of the present invention can be used as the P-type layer of a diode, such as a pn or p-i-n diode, or a solar cell such as described in the Carlson patent. It can also be used as a semiconductor layer of a thin film field effect transistor of the type shown in U.S. Pat. No. 3,258,663 to P. K. Weimer, issued June 28, 1966, entitled "Solid State Device With Gate Electrode On Thin Insulative Film". When making a semiconductor device using the P-type hydrogenated amorphous silicon layer formed by the present method, the heating step to increase the conductivity of the layer does not have to be carried out as a separate operation, but can be part of another step in the making of the semiconductor device, such as the deposition of other materials at the appropriate temperature.

I claim:
1. A method of forming P-type hydrogenated amorphous silicon comprising the steps of
    subjecting a substrate to a gaseous mixture of a silicon hydride and an acceptor material with the substrate being heated at a temperature of no greater than about 120° C. so as to deposit a layer of acceptor doped hydrogenated amorphous silicon on the substrate, and then
    heating the deposited layer at a temperature greater than 130° C. but less than the temperature at which hydrogen will disassociate from the layer to increase the conductivity of the deposited layer.

2. A method in accordance with claim 1 in which the substrate is subjected to a glow discharge when it is subjected to the gaseous mixture to deposit the hydrogenated amorphous silicon layer thereon.

3. A method in accordance with claim 2 wherein the deposited hydrogenated amorphous silicon layer is heated to a temperature of between 120° C. and 350° C.

4. A method in accordance with claim 3 in which the hydrogenated amorphous silicon layer is heated to a temperature of 180° C. ± 30° C.

5. A method in accordance with claim 2 in which silicon hydride is silane or a polysilane.

6. A method in accordance with claim 5 in which the acceptor material includes atoms of either boron, gallium or aluminum.

* * * * *